(12) United States Patent
Smith

(10) Patent No.: US 7,772,818 B2
(45) Date of Patent: Aug. 10, 2010

(54) METHOD AND APPARATUS FOR MEASURING AN AVERAGE OUTPUT CURRENT OF A SWITCHING REGULATOR USING CURRENT-SENSING-CIRCUITRY

(75) Inventor: Eric Smith, San Jose, CA (US)

(73) Assignee: Apple Inc., Cupertino, CA (US)

( * ) Notice: Subject to any disclaimer, the term of this patent is extended or adjusted under 35 U.S.C. 154(b) by 460 days.

(21) Appl. No.: 11/732,756

(22) Filed: Apr. 3, 2007

(65) Prior Publication Data

US 2008/0246460 A1 Oct. 9, 2008

(51) Int. Cl.
*G05F 1/565* (2006.01)
(52) U.S. Cl. ............... 323/282; 363/141; 324/713
(58) Field of Classification Search ........... 323/282, 323/286; 363/141; 361/690; 324/713; 702/64
See application file for complete search history.

(56) References Cited

U.S. PATENT DOCUMENTS 6,281,485 B1 * 8/2001 Siri .................. 250/203.4
6,559,684 B2 * 5/2003 Goodfellow et al. ........ 327/53
2005/0219926 A1 * 10/2005 Tai et al. .................. 365/207

* cited by examiner

*Primary Examiner*—Harry Behm
(74) *Attorney, Agent, or Firm*—Park, Vaughan & Fleming LLP

(57) ABSTRACT

One embodiment of the present invention provides an apparatus that measures the average-output-current produced by a switching regulator within an electronic device. The apparatus includes current-sensing-circuitry coupled to a switching field-effect-transistor (FET) within the switching regulator, wherein the current-sensing-circuitry is configured to bypass a small sense current from the conducting current of the switching-FET according to a sense ratio, wherein the conducting current is controlled by a control signal for the switching regulator. The apparatus also includes a current-to-voltage-converter coupled to the current-sensing-circuitry which is configured to convert the sense current into a sense voltage. The apparatus further includes voltage-averaging-circuitry which is configured to produce an average-sense-voltage from the sense voltage. This sense voltage is coupled to the input of the voltage-average-circuitry through a switch, which is gated by the control signal. The average-output-current of the switching regulator is indicated by the average-sense-voltage.

16 Claims, 3 Drawing Sheets

METHOD AND APPARATUS FOR MEASURING AN AVERAGE OUTPUT CURRENT OF A SWITCHING REGULATOR USING CURRENT-SENSING-CIRCUITRY

BACKGROUND

1. Field of the Invention

The present invention relates to techniques for determining the power consumption of an electronic device, such as an integrated circuit (IC) chip. More specifically, the present invention relates to a method and apparatus for determining the power consumption of an electronic device by measuring an average output current generated by a switching regulator that supplies power to the electronic device.

2. Related Art

Rapid advances in computing technology presently make it possible to perform trillions of operations each second on data sets as large as a trillion bytes. These advances can be largely attributed to an exponential increase in the density and complexity of integrated circuits (ICs). Unfortunately, in conjunction with this increase in computational power, power consumption and heat dissipation of ICs has also increased dramatically.

Increasing power consumption and associated heat dissipation creates serious challenges for power management and cooling in computing devices, especially for portable computers. If the real-time power consumption of system components can be measured, the system can provision power to system components more intelligently, and can also adjust cooling mechanisms, for example, by increasing/decreasing fan speed, to more efficiently remove waste heat from the computer system.

Modern power supplies within computer systems often utilize switching regulators to provide a substantially constant voltage to drive system components, such as IC chips. A switching regulator typically comprises control logic, a switching circuit, and an "LC tank" circuit. The control logic typically generates two square-wave control signals that are complements of each other. The switching circuit typically includes at least one high-side switching metal-oxide-semiconductor field-effect transistor (MOSFET) and one low-side switching MOSFET, which are coupled in series. The two out-of-phase control signals from the control logic are coupled to the gates of the two switching MOSFETs to drive the two MOSFETs. Because each control signal switches between a high voltage and a low voltage, the two MOSFETs will be turned on and off periodically by the control signals.

To convert AC output currents from the MOSFETs into a DC voltage, the MOSFETs are coupled to the LC tank circuit. Specifically, when the high-side MOSFET is turned on and the low-side MOSFET is turned off, the output current flows through the inductor L and capacitor C. This causes energy to be stored within the inductor and the capacitor. A portion of the output current also drives the load. Next, when the high-side MOSFET is turned off and the low-side MOSFET is turned on, the energy stored within the inductor and the capacitor continues to provide a near DC drive current to the load.

Note that the output current from the switching regulator to the load can change dynamically during system operation. For example, the output current to a CPU typically increases as the utilization of the CPU increases, whereas the output current to the CPU decreases as the CPU utilization drops. During this time, the voltage on the load remains constant. Consequently, one can monitor the power usage of the load by monitoring the average output current from the switching regulator.

One technique to measure the average output current from the switching regulator is to insert a current sensing component, for example, an ammeter, in series with the load. However, this technique can cause significant amount of dissipative loss on the current sensor because the entire output current flows through this current-sensing component.

Another technique is to use a component that is already in series with the load to measure the output current. For example, one can obtain the output current by first measuring the voltage across inductor L and then computing the current by dividing the voltage by the resistance of inductor L. Unfortunately, the resistance of inductor L is typically not a constant and is difficult to measure. For example, this resistance can change significantly because of temperature variations.

Hence, what is needed is a method and an apparatus for determining the average output current from a switching regulator without the problems described above.

SUMMARY

One embodiment of the present invention provides an apparatus that measures the average-output-current produced by a switching regulator within an electronic device. The apparatus includes current-sensing-circuitry coupled to a switching field-effect-transistor (FET) within the switching regulator, wherein the current-sensing-circuitry is configured to bypass a small sense current from the conducting current of the switching-FET according to a sense ratio, wherein the conducting current is controlled by a control signal for the switching regulator. The apparatus also includes a current-to-voltage-converter coupled to the current-sensing-circuitry which is configured to convert the sense current into a sense voltage. The apparatus further includes voltage-averaging-circuitry which is configured to produce an average-sense-voltage from the sense voltage. This sense voltage is coupled to the input of the voltage-average-circuitry through a switch, which is gated by the control signal. The average-output-current of the switching regulator is indicated by the average-sense-voltage.

In a variation on this embodiment, the current-sensing-circuitry includes a sense FET coupled in parallel with a low-side switching FET in the switching regulator.

In a further variation on this embodiment, the current-to-voltage converter is configured to provide both the sense FET and the low-side switching FET with the same voltage.

In a variation on this embodiment, the voltage-averaging-circuitry includes a track-and-hold circuit.

In a variation on this embodiment, the voltage-average-circuitry is configured to average the sense voltage input when the switch is activated by the control signal and is configured to maintain the average-sense-voltage when the switch is deactivated by the control signal, thereby facilitating tracking of the average-sense-voltage during a period of the control signal.

In a variation on this embodiment, the average-output-current is used to determine power consumption of the electronic device.

In a variation on this embodiment, the current-to-voltage-converter and the voltage-averaging-circuitry are integrated onto an IC chip. The current-sensing-circuitry can also be integrated onto the IC chip.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

Overview

The present invention determines the real-time power consumption of an integrated circuit (IC) chip by measuring the average output current from the switching regulator that supplies power to the IC chip. Specifically, a current-sensing-circuit is used to bypass a tiny sense current from a main switching-regulator-output-current according to a precise ratio. A current-to-voltage-converter is then used to convert this sense current into a sense voltage, which can be more conveniently manipulated. Next, the sense voltage is averaged using a voltage-averaging-circuit to produce an average readout. In particular, the voltage-averaging operation is synchronized with the switching operation of the switching regulator, thereby allowing the average readout to be an accurate representation of the average output current of the switching regulator.

A Typical Switching Regulator

Figure 1A:
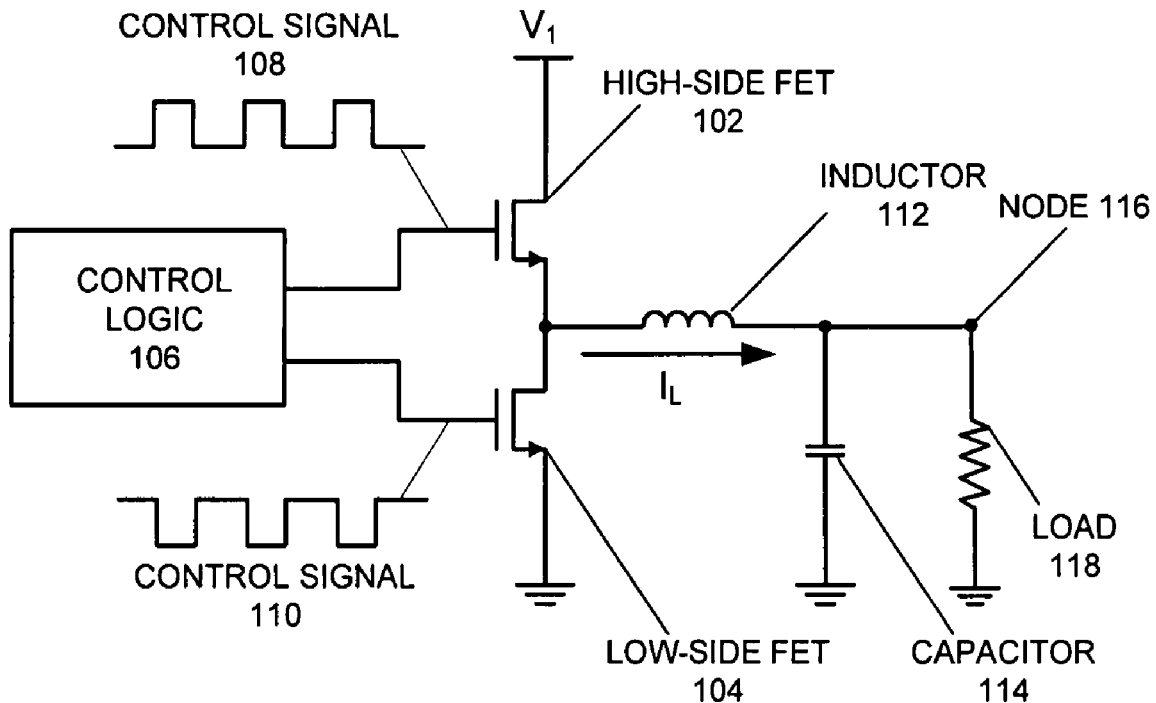
FIG. 1A presents an exemplary circuit diagram of a typical switching regulator.

FIG. 1A presents an exemplary circuit diagram of a typical switching regulator 100. It contains a high-side switching metal-oxide-semiconductor field-effect-transistor MOSFET 102 ("high-side FET" hereafter) and a low-side switching MOSFET 104 ("low-side FET" hereafter), which are both controlled by control logic 106. In one embodiment of the present invention, MOSFET 102 and 104 are power MOSFETs.

Control logic 106 drives the FETs 102 and 104 separately using periodic control signals 108 and 110 (shown as squares waves), wherein the two control signals are complements of each other. Hence, during each control period, the two switching FETs take turns conducting current.

More specifically, when high-side FET 102 is turned on by control signal 108 (i.e., when control signal 108 is high and control signal 110 is low), the drain voltage supply "$V_1$" causes a linearly increasing current $I_L$ to flow through inductor 112 and capacitor 114. This allows energy to be stored in the inductor and the capacitor. Part of the conducting current also drives load 118. Meanwhile, low-side FET 104 is inactive.

When low-side FET 104 is conducting (i.e., when control signal 110 is high and control signal 108 is low), both inductor 112 and capacitor 114 release stored energy to drive load 118, which causes the inductor current $I_L$ to decease linearly. Note that during each switching cycle, capacitor 114 operates to "smooth out" the ripples in the voltage at node 116 so that load 118 receives a "regulated" voltage. Meanwhile, high-side FET 102 is inactive.

Figure 1B:
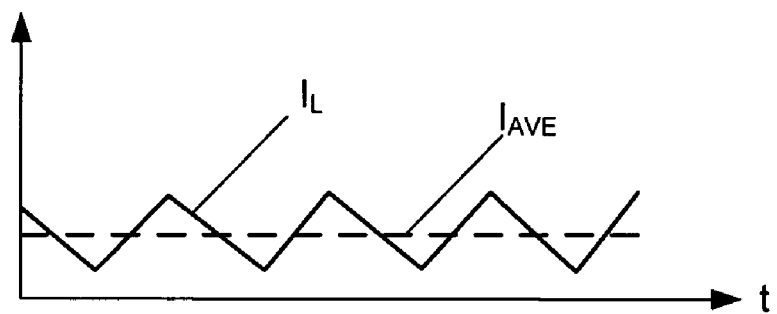
FIG. 1B illustrates inductor current as a function of time during switching operation in accordance with an embodiment of the present invention.

FIG. 1B illustrates inductor current as a function of time during switching operation in accordance with an embodiment of the present invention. Note that inductor current $I_L$ has a sawtooth waveform wherein the shape and amplitude of the sawtooth is determined by the duty cycle of control signals 108 and 110. Also note that inductor current $I_L$ has an average value $I_{ave}$ which remains at substantially the same value during the two phases of each switching cycle. Consequently, one can measure the average switching regulator current when either the high-side FET is active or the low-side FET is active.

Measuring Average Output Current of the Switching Regulator

Figure 2:
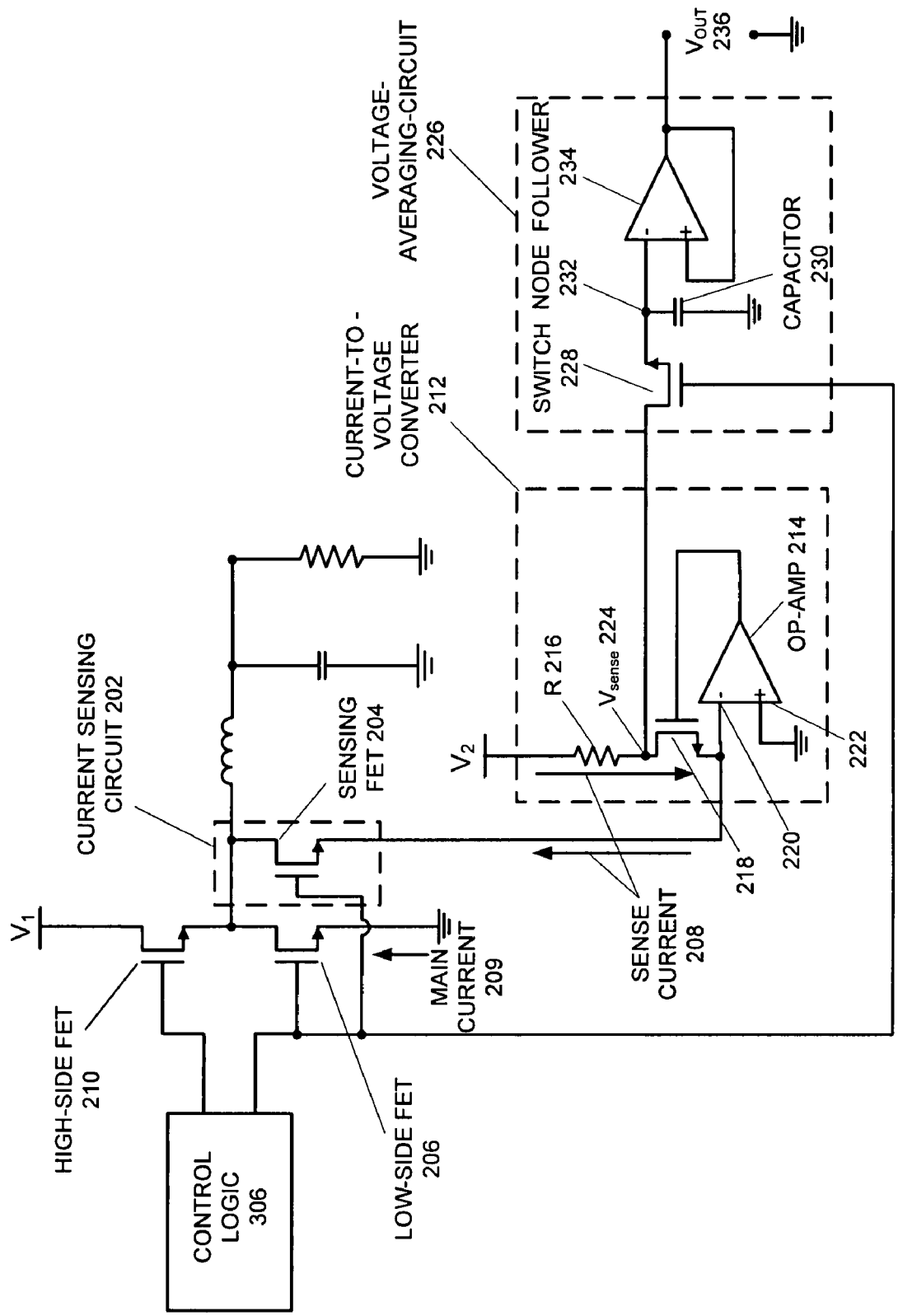
FIG. 2 illustrates an exemplary circuit diagram for a switching regulator coupled to average-output-current-measurement circuitry in accordance with an embodiment of the present invention.

FIG. 2 illustrates an exemplary circuit diagram for a switching regulator coupled to average-output-current-measurement circuitry in accordance with an embodiment of the present invention.

In one embodiment of the present invention, the average-output-current-measurement circuitry includes three subcomponents: a current sensing circuit, a current-to-voltage converter, and a voltage-averaging circuit. We describe each of subcomponents in more detail below.

Current Sensing Circuit

The embodiment of the present invention illustrated in FIG. 2 utilizes a current sensing circuit to bypass a tiny sense current from the main current being measured. In this embodiment, a current sensing circuit 202 comprises a sensing FET 204 which is coupled in parallel with a low-side FET 206. More specifically, the drains and gates of both sensing FET 204 and low-side FET 206 are tied together. Hence, the same control signal that controls low-side FET 206 also controls sensing FET 204. The source of low-side FET 206 is connected to the ground while the source of sensing FET 204 is used as the output node. Although the sources of the two FETs are not tied together, it is desirable that they have the same voltage. We describe a technique that sets the source voltage of sensing FET 204 to be the same as the source voltage of low-side FET 206 below.

Sensing FET 204 conducts a tiny sense current 208, which is a small fraction of a main switching regulator current 209 conducted by low-side FET 206. The ratio between main switching regulator current 209 and sense current 208 is proportionate to a predetermined large number. In one embodiment, this ratio is greater than 500.

In one embodiment of the present invention, sensing FET 204 and low-side FET 206 are fabricated using the same semiconductor processes and same materials, and therefore the sense ratio can be precisely controlled by the physical design parameters, such as by the gate width to gate length ratio (W/L). Note that if the gate-to-source voltage $V_{GS}$ and drain-to-source voltage $V_{DS}$ are substantially the same for these two FETs, the sense ratio equals $(W/L)_{FET\ 206}/(W/L)_{FET\ 204}$. Note that both FETs 204 and 206 can be N-type FETs or P-type FETs. Also note that the drain and the source within each FET is interchangeable.

Although we describe a current sensing circuit 202 in the context of a simple sensing FET, other techniques can be used. For example, it is possible to bypass a small sense current according to a precise ratio from the main current without using sensing FET 204. In one embodiment of the present invention, current sensing circuit 202 can be alternatively coupled in parallel with high-side FET 210 to draw a sense circuit when high-side FET 210 is conducting.

Note that because sense current 208 is significantly smaller than the main current, sensing circuit 208 consumes very little power and has negligible effect on the switching regulator. However, this current can be difficult to measure because it has an AC behavior and very small amplitude. This problem can be remedied by applying a gain to the sensing current as is described below.

Current Gain Stage

Sense current 208 in sensing FET 204 is very small and therefore can be difficult to measure. Hence, one embodiment of the present invention provides a gain to the sense current prior to measuring this current. More specifically, this gain can be provided by a current-to-voltage (I-V) converter 212. Generally, an I-V converter converts a current i to a voltage v according to v=iR, wherein R is a known resistance. As seen in FIG. 2, I-V converter 212 comprises: an operational amplifier (op-amp) 214, a high precision resistor 216 which is coupled to a voltage source "$V_2$", and a transistor 218 which is coupled between resistor 216 and the output of op-amp 214. Note that resistor 216 can also be implemented as an active load.

Inverting input 220 of op-amp 214 is coupled to the source node of sensing FET 204. Additionally, non-inverting input 222 of op-amp 214 is connected to the ground, which also brings the voltage at inverting input 220 and the source node of sensing FET 204 to ground (due to a "virtual ground"). Consequently, low-side FET 206 and sensing FET 204 have exactly the same voltages $V_{GS}$ and $V_{DS}$, which ensures that the current ratio between the two FETs is based on the predetermined sense ratio.

Note that because op-amp 214 and voltage $V_2$ do not draw current from the inputs, the current flowing through resistor 216 and transistor 218 also equals sense current 208. Hence, the drain voltage of transistor 218 equals $V_2-I_{sense}R$, wherein $I_{sense}$ represents sense current 208. Because $V_2$ and R are both known, this drain voltage can be used as an accurate indicator of sense current 208. We refer to this drain voltage as sense voltage 224 below.

Note that the current gain stage in the present invention is not limited to the specific configuration of I-V converter 212. Any other circuit that is capable of holding the source node of sensing FET 204 to ground and performing a current-to-voltage conversion can be used in place of I-V converter 212.

Voltage Averaging Circuit

Sense voltage 224 is still an AC signal, but is considerably easier to manipulate than sense current 208. As seen in FIG. 2, sense voltage 224 is coupled to a voltage-averaging-circuit 226, which performs an averaging operation on this input voltage.

In one embodiment of the present invention, voltage-averaging-circuit 226 is a track-and-hold (T/H) circuit. This T/H circuit comprises a switch 228 and a capacitor 230. In one embodiment of the present invention, switch 228 is implemented using a MOSFET 228. As seen in FIG. 2, the gate of MOSFET 228 is coupled to the control signal which controls both low-side FET 206 and sensing FET 204. Meanwhile, the drain voltage of MOSFET 228 is coupled to sense voltage 224.

The averaging operation in FIG. 2 proceeds as follows.

Tracking Phase: When the control signal is high, MOSFET 228 is turned on. This allows sense voltage 224 to charge or discharge capacitor 230, depending on the previous voltage value at node 232. The charging/discharging process "smoothes out" the input waveform and results in a near constant voltage $\overline{V}$ on node 232. Note that this average process is synchronized with the time window when low-side FET 206 is conducting. More specifically, it begins when FET 206 turns on and ends when FET 206 turns off. Consequently, the average voltage $\overline{V}$ at node 232 provides an accurate representation of sense current 208.

Holding Phase: When the control signal is low, MOSFET 228 is turned off. Because there is no current path for capacitor 230, capacitor 230 holds the average voltage $\overline{V}$ at node 232 until next control signal period begins.

Note that the average voltage $\overline{V}$ is valid during a full control logic period. This is possible because the control signal for the low-side FET is also used to synchronize the current sensing at sensing FET 204, and the voltage averaging at node 232. In one embodiment of the present invention, the average voltage $\overline{V}$ at node 232 can be accurately measured by inserting a voltage follower 234 which decouples the capacitor 226 from the voltage measuring mechanism at $V_{out}$ 236.

Because the average output voltage $\overline{V}$ can be measured, an average sense current $I_{sense}$ is obtained according to $(V_2-\overline{V})/R$. Consequently, the average current produced by the switching regulator during each control period equals $N(V_2-\overline{V})/R$, wherein N is the sense ratio. Furthermore, the power consumed by the load can be obtained by multiplying this average current by the constant voltage on the load.

Note that although we describe using a simple MOSFET and a capacitor to perform a timed voltage averaging operation, other circuits that perform a timing controlled voltage averaging function can be used in place of voltage averaging circuit 226.

Integrated Circuit

Note that the above described three circuit modules can be integrated into a single IC module.

Figure 3:
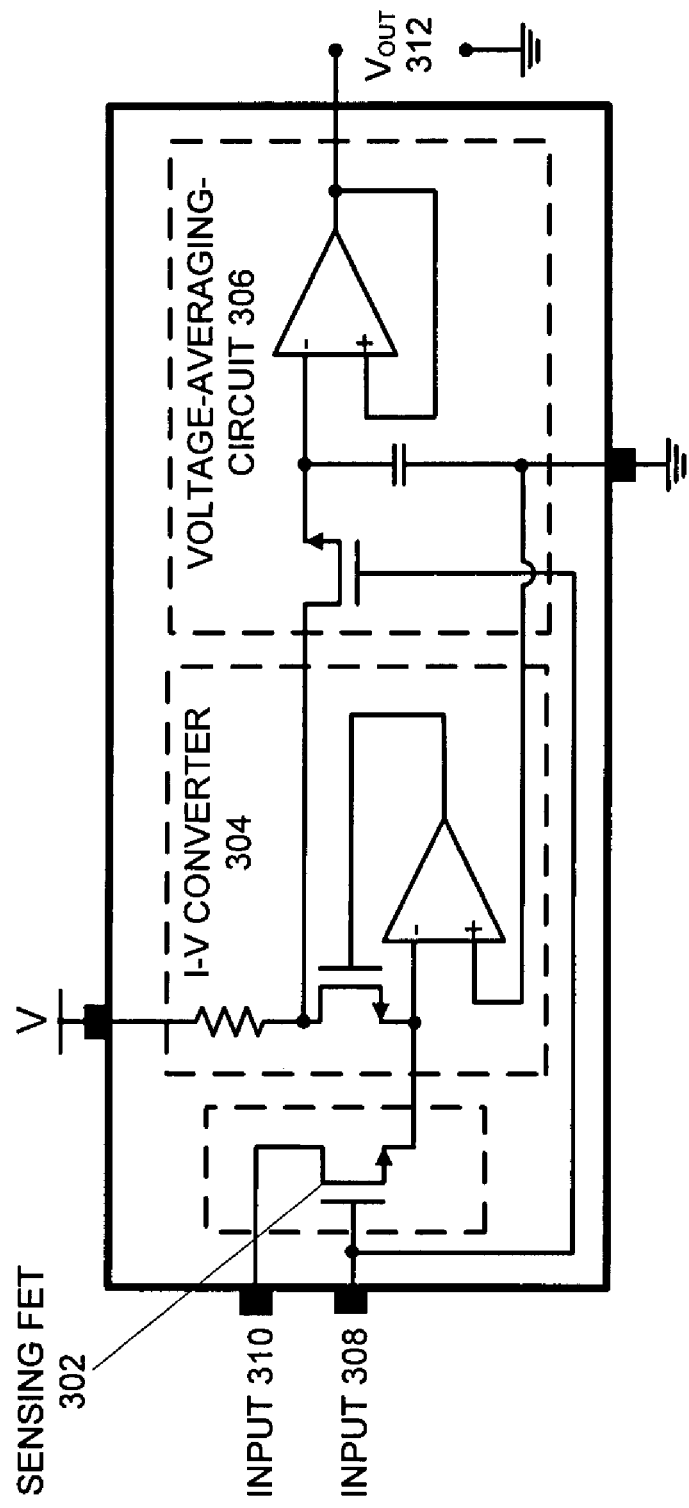
FIG. 3 illustrates an integrated average-current-measurement circuit 300 in accordance with an embodiment of the present invention.

For example, FIG. 3 illustrates an integrated average-current-measurement circuit 300 in accordance with an embodiment of the present invention. Specifically, average-current-measurement circuit 300 includes sensing FET 302, I-V converter 304, and voltage-averaging-circuit 306, which are coupled together in the same manner as described in FIG. 2. IC 300 further comprises an input 308 for receiving the control signal for sensing FET 302 and circuit 306, and an input 310 which is coupled to the drain of low-side FET of the switching regulator. IC 300 also comprises a single voltage output 312.

In a further embodiment, the low-side FET and the sensing FET can be replaced by an integrated current sensing FET, which comprises a main power FET and a sense FET. In this embodiment, the I-V converter and the voltage-averaging-circuit can be further integrated into an IC chip. This integrated IC has a number of inputs, which include a current input from the sense FET, and a control input from the control logic. The IC provides a single voltage output which represents the average switching regulator current.

Note that in both embodiments, the integrated ICs can be disabled by the control signal input.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. An apparatus that measures an average-output-current produced by a switching regulator within an electronic device, comprising:
   current-sensing-circuitry coupled to a switching field-effect-transistor (FET) within the switching regulator, wherein the current-sensing-circuitry is configured to bypass a small sense current from the conducting current of the switching-FET according to a sense ratio, wherein the conducting current is controlled by a control signal for the switching regulator;
   a current-to-voltage-converter coupled to the current-sensing-circuitry configured to convert the sense current into a sense voltage; and
   voltage-averaging-circuitry configured to produce an average-sense-voltage from the sense voltage,
      wherein the sense voltage is coupled to the input of the voltage-average-circuitry through a switch; and
      wherein the switch is gated by the control signal which is directly connected to the switch;
   wherein the average-output-current of the switching regulator is indicated by the average-sense-voltage.

2. The apparatus of claim 1, wherein the current-sensing-circuitry includes a sense FET coupled in parallel with a low-side switching FET in the switching regulator.

3. The apparatus of claim 2, wherein the current-to-voltage converter is configured to provide both the sense FET and the low-side switching FET with the same voltage.

4. The apparatus of claim 1, wherein the voltage-averaging-circuitry includes a track-and-hold circuit.

5. The apparatus of claim 1, wherein the voltage-average-circuitry is configured to average the sense voltage input when the switch is activated by the control signal and is configured to maintain the average-sense-voltage when the switch is deactivated by the control signal, thereby facilitating tracking of the average-sense-voltage during a period of the control signal.

6. The apparatus of claim 1, wherein the average-output-current is used to determine power consumption of the electronic device.

7. The apparatus of claim 1, wherein the current-sensing-circuitry, the current-to-voltage-converter, and the voltage-averaging-circuitry are integrated onto an integrated circuit chip.

8. The apparatus of claim 1, wherein the current-to-voltage-converter and the voltage-averaging-circuitry are integrated onto an integrated circuit chip.

9. A method for measuring an average-output-current produced by a switching regulator within an electronic device, comprising:
   using current-sensing-circuitry which is coupled to a switching field-effect-transistor (FET) within the switching regulator to bypass a small sense current from the conducting current of the switching-FET according to a sense ratio, wherein the conducting current is controlled by a control signal for the switching regulator;
   converting the sense current into a sense voltage using a current-to-voltage-converter coupled to the current-sensing-circuitry; and
   producing an average-sense-voltage from the sense voltage using voltage-averaging-circuitry,
      wherein the sense voltage is coupled to the input of the voltage-average-circuitry through a switch; and
      wherein the switch is gated by the control signal which is directly connected to the switch;
   wherein the average-output-current of the switching regulator is indicated by the average-sense-voltage.

10. The method of claim 9, wherein the current-sensing-circuitry includes a sense FET coupled in parallel with a low-side switching FET in the switching regulator.

11. The method of claim 10, wherein the current-to-voltage converter is configured to provide both the sense FET and the low-side switching FET with the same voltage.

12. The method of claim 9, wherein the voltage-averaging-circuitry includes a track-and-hold circuit.

13. The method of claim 9, further comprising:
   averaging the sense voltage input using the voltage-average-circuitry when the switch is activated by the control signal; and
   maintaining the average-sense-voltage using the voltage-average-circuitry when the switch is deactivated by the control signal,
   thereby facilitating tracking of the average-sense-voltage during a period of the control signal.

14. The method of claim 9, further comprising determining a power consumption of the electronic device based on the average-output-current.

15. The method of claim 9, wherein the current-sensing circuitry, the current-to-voltage-converter, and the voltage-averaging-circuitry are integrated onto an integrated circuit chip.

16. The method of claim 9, wherein the current-to-voltage converter and the voltage-averaging-circuitry are integrated onto an integrated circuit chip.

* * * * *

UNITED STATES PATENT AND TRADEMARK OFFICE
CERTIFICATE OF CORRECTION

| | | |
|---|---|---|
| PATENT NO. | : 7,772,818 B2 | Page 1 of 1 |
| APPLICATION NO. | : 11/732756 | |
| DATED | : August 10, 2010 | |
| INVENTOR(S) | : Eric Smith | |

It is certified that error appears in the above-identified patent and that said Letters Patent is hereby corrected as shown below:

In column 8, line 44-45, in claim 15, delete "current-sensing circuitry" and insert -- current-sensing-circuitry --, therefor.

In column 8, line 48-49, in claim 16, delete "current-to-voltage converter" and insert -- current-to-voltage-converter --, therefor.

Signed and Sealed this
Twenty-second Day of November, 2011

David J. Kappos
*Director of the United States Patent and Trademark Office*